US008525390B2

(12) United States Patent
Allaei

(10) Patent No.: US 8,525,390 B2
(45) Date of Patent: Sep. 3, 2013

(54) FLUID POWER GENERATION SYSTEM HAVING A GENERATOR WITH AN ELECTRICAL-CHARGE-PRODUCING MATERIAL

(75) Inventor: Daryoush Allaei, Minnetonka, MN (US)

(73) Assignee: Sheer Wind, Inc., Chaska, MI (US)

( * ) Notice: Subject to any disclaimer, the term of this patent is extended or adjusted under 35 U.S.C. 154(b) by 390 days.

(21) Appl. No.: 12/902,308

(22) Filed: Oct. 12, 2010

(65) Prior Publication Data

US 2012/0086310 A1 Apr. 12, 2012

(51) Int. Cl.
*H01L 41/113* (2006.01)
(52) U.S. Cl.
USPC .......................................... 310/339; 310/319
(58) Field of Classification Search
USPC .......................................... 310/317–319, 339
See application file for complete search history.

(56) References Cited

U.S. PATENT DOCUMENTS

| 4,536,674 | A | 8/1985 | Schmidt | |
|---|---|---|---|---|
| 5,621,264 | A * | 4/1997 | Epstein et al. | 310/339 |
| 6,424,079 | B1 * | 7/2002 | Carroll | 310/339 |
| 7,453,187 | B2 * | 11/2008 | Richards et al. | 310/339 |
| 7,495,350 | B2 | 2/2009 | Pinkerton et al. | |
| 7,521,841 | B2 * | 4/2009 | Clingman et al. | 310/339 |
| 7,573,143 | B2 | 8/2009 | Frayne | |
| 2008/0074002 | A1 | 3/2008 | Priya et al. | |
| 2008/0129254 | A1 | 6/2008 | Frayne | |
| 2008/0297119 | A1 | 12/2008 | Frayne | |
| 2009/0295163 | A1 | 12/2009 | Frayne | |
| 2009/0309362 | A1 | 12/2009 | Frayne | |
| 2010/0052324 | A1 | 3/2010 | Priya | |
| 2010/0084871 | A1 * | 4/2010 | Filardo | 290/54 |
| 2010/0133954 | A1 * | 6/2010 | Despesse et al. | 310/319 |
| 2010/0244629 | A1 * | 9/2010 | Nagashima et al. | 310/339 |
| 2010/0308592 | A1 * | 12/2010 | Frayne | 290/54 |
| 2011/0156532 | A1 * | 6/2011 | Churchill et al. | 310/319 |
| 2012/0074815 | A1 * | 3/2012 | Jean-Mistral | 310/339 |

FOREIGN PATENT DOCUMENTS

CN 101575082 A 11/2009
FR 2922607 A1 4/2009

(Continued)

OTHER PUBLICATIONS

S. Priya, et al. "Piesoelectric Windmill: A Novel Solution to Remote Sensing", Japanese Journal of Applied Physics, vol. 44, No. 3, 2005, pp. L104-L107.
S. J. Oh, et al. "Development of a Tree-Shaped Wind Power System Using Piezo-Electric Materials", Journal of the Korean Solar Energy Society, vol. 28, No. 3, 2008, ISSN 1598-6411, pp. 53-59.

(Continued)

*Primary Examiner* — Thomas Dougherty
(74) *Attorney, Agent, or Firm* — Leffert Jay & Polglaze, P.A.

(57) ABSTRACT

An embodiment of a fluid power generation system has a generator comprising an electrical-charge-producing material and a pair of end boundary constraints. One of the end boundary constraints of the pair of end boundary constraints is physically coupled to the electrical-charge-producing material adjacent to an end of the electrical-charge-producing material and the other one of the pair of end boundary constraints is physically coupled to the electrical charge-producing material adjacent to an opposite end of the electrical-charge-producing material. For some embodiments, the end boundary constraints may be active or passive. For other embodiments, at least one of the end boundary constraints may be electrically coupled to a controller for adjusting vibration characteristics of the generator.

31 Claims, 14 Drawing Sheets

(56) References Cited

FOREIGN PATENT DOCUMENTS

| | | | |
|---|---|---|---|
| JP | 2001231273 A | | 8/2001 |
| JP | 2002262584 A | | 9/2002 |
| JP | 2007016756 A | | 1/2007 |
| JP | 2007198175 A | | 8/2007 |
| JP | 2007-198175 A | * | 8/2009 |
| JP | 2009243393 A | | 10/2009 |
| KR | 1020080013569 A | | 2/2008 |
| WO | WO 2009/058759 A2 | | 5/2009 |

OTHER PUBLICATIONS

S. Li, et al. "Vertical-Stalk Flapping-Leaf Generator for Wind Energy Harvesting", Proceedings of ASME 2009 Conference on Smart Materials, adaptive Structures and Intelligent Systems, SMASIS 2009, Sep. 20-24, 2009, pp. 1-9.

R. Dickson, "Wind Tree", http://peswiki.com/index.php/directory:Rick_Dickson:Wind_Tree, Sep. 26, 2007, pp. 1-8.

S. Li, et al., "Flapping Piezo-Leaf Generator for Wind Energy Harvesting", Cornell Computational Synthesis Laboratory, http://ccsl.mae.cornell.deu/node/116, pp. 1-2, 2009.

* cited by examiner

FLUID POWER GENERATION SYSTEM HAVING A GENERATOR WITH AN ELECTRICAL-CHARGE-PRODUCING MATERIAL

FIELD

The present disclosure relates generally to fluid power generation and, in particular, in one or more embodiments, the present disclosure relates to fluid power generation systems having generators with electrical-charge-producing materials.

BACKGROUND

Due to the recent energy problems that have arisen, considerable interest has been given to converting the kinetic energy of fluid flows occurring in nature into electrical power, e.g., using wind flows in wind power generation systems (e.g., that are sometimes called wind energy conversion systems) and water current flows in kinetic hydropower generation systems. For example, wind energy conversion systems involve directing wind through a turbine that rotates an electrical generator, causing the electrical generator to produce electrical power, whereas kinetic hydropower generation systems typically involve submerging a turbine under water and directing flowing water current through the turbine, causing the turbine to rotate an electrical generator for producing electrical power.

Such turbines are complex machines with several sub-machines that convert the kinetic energy of the moving fluid to electrical power. That is, these machines have a large number of moving parts that are subject to failure and that require considerable maintenance, resulting in high maintenance costs.

In particular, the power generation depends on the length of the turbine blades, e.g., the longer each turbine blade, the higher the power generation. However, long blades are costly, can be subjected to defects and failure, take up a large amount of space, and generate excessive noise and vibration. Longer propellers increase not only the cost of material and installation, but also the cost of maintenance. As such, current wind energy conversion systems and kinetic hydropower generation systems typically suffer from low efficiency, high capital cost, unpredictable failures, excessively high noise and vibration, and/or high maintenance.

Many of these turbines operate at relatively low rotational speeds (e.g., typically 20 rpm for wind turbines) and require gears to increase the rotational speed up to rotational speeds that are useful for the generator (e.g., typically 1500 rpm for a 1.5 MW generator). This involves high levels of torque and accompanying high gear-mesh forces that can cause the gears to fail, thus meaning considerable maintenance to reduce the amount of failures. Because of the low speed of the turbine, the various gearbox components are usually supported by rolling element bearings. These bearings are subject to significant radial loads that can cause the bearings to fail prematurely, thus meaning considerable maintenance to reduce the amount of failures.

For the reasons stated above, and for other reasons stated below which will become apparent to those skilled in the art upon reading and understanding the present specification, there is a need in the art for alternatives to existing fluid power generation systems, such as wind energy conversion systems and kinetic hydropower generation systems.

SUMMARY

An embodiment of the present invention provides a fluid power generation system that has a generator having an electrical-charge-producing material and a pair of end boundary constraints. One of the end boundary constraints of the pair of end boundary constraints is physically coupled to the electrical-charge-producing material adjacent to an end of the electrical-charge-producing material and the other one of the pair of end boundary constraints is physically coupled to the electrical charge-producing material adjacent to an opposite end of the electrical-charge-producing material. For some embodiments, the end boundary constraints may be active or passive. For other embodiments, at least one of the end boundary constraints may be electrically coupled to a controller for adjusting vibration characteristics of the generator.

DETAILED DESCRIPTION

Figure 1:
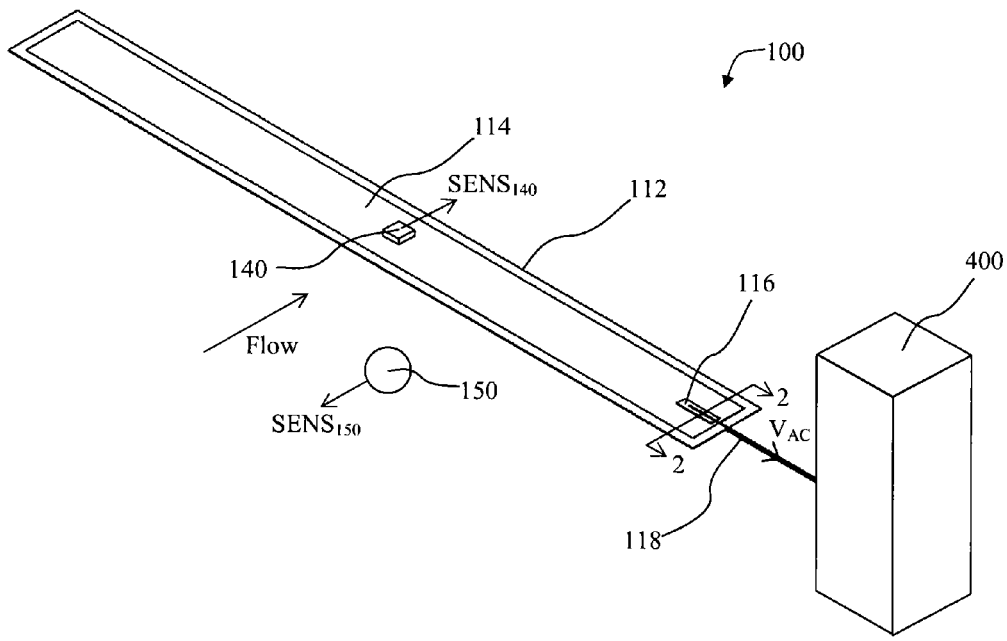
FIG. 1 illustrates a generator, according to an embodiment.
Figure 2:
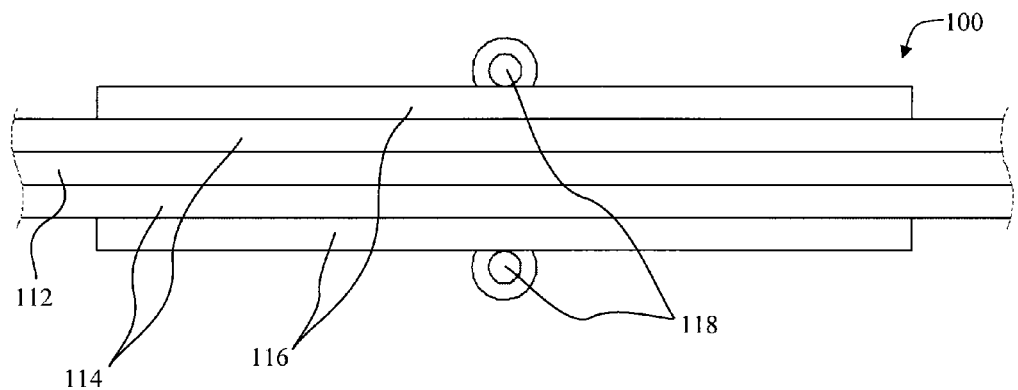
FIG. 2 is a cross-sectional view taken along line 2-2 in FIG. 1, according to another embodiment.

In the following detailed description of the present embodiments, reference is made to the accompanying drawings that form a part hereof, and in which are shown by way of illustration specific embodiments that may be practiced. These embodiments are described in sufficient detail to enable those skilled in the art to practice disclosed subject matter, and it is to be understood that other embodiments may be utilized and that process, electrical or mechanical changes may be made without departing from the scope of the claimed subject matter. The following detailed description is, therefore, not to be taken in a limiting sense, and the scope of the claimed subject matter is defined only by the appended claims and equivalents thereof.

FIG. 1 illustrates a generator 100, e.g., a voltage-generating strip. For example, generator may be called a power generator, in that it can generate electrical power while vibrating in response to a fluid flowing thereover. FIG. 2 is a cross-sectional view of generator 100 (with cross-hatching omitted for clarity) taken along line 2-2 in FIG. 1.

For one embodiment, generator 100 may include an electrical-charge-producing (e.g., a voltage-generating) material, such as piezoelectric material 112, e.g., a piezoelectric film. Piezoelectric material 112 can produce a charge (e.g., output a voltage) in response to vibratory bending and/or torsional stresses imparted thereto by a fluid flowing over generator 100. Table 1 gives some examples of suitable piezoelectric materials.

TABLE 1

Examples of suitable piezoelectric materials

| | Chemical Formula |
|---|---|
| Man-made Crystals | |
| Gallium Orthophosphate | $GaPO_4$ |
| Langasite | $La_3Ga_5SiO_{14}$ |
| Man-made Ceramics | |
| Barium Titanate | $BaTiO_3$ |
| Lead Magnesium Niobate | PMN |
| Lead Titanate | $PbTiO_3$ |
| Lead Zirconate Titanate (PZT) | $Pb[Zr_xTi_{1-x}]O_3\ 0 < x < 1$ |
| Potassium Niobate | $KNbO_3$ |
| Lithium Niobate | $LiNbO_3$ |
| Lithium Tantalate | $LiTaO_3$ |
| Sodium Tungstate | $Na_2WO_3$ |
| | $Ba_2NaNb_5O_5$ |
| | $Pb_2KNb_5O_{15}$ |
| Lead-free Piezoceramics | |
| Sodium Potassium Niobate | NaKNb |
| Bismuth Ferrite | $BiFeO_3$ |
| Sodium Niobate | $NaNbO_3$ |
| Piezoelectric Polymers | |
| Polyvinylidene Fluoride (PVDF) | $-(C_2H_2F_2)_n-$ |

Piezoelectric material 112 may be interposed between electrodes 114, e.g., layers (e.g., films) of electrically conductive material. That is, electrodes 114 may be electrically coupled to (e.g., by direct physical contact with) opposing surfaces of piezoelectric material 112. For example, electrodes 114 may be in direct physical contact with the opposing surfaces of piezoelectric material 112. For some embodiments, a protective material may be formed on the opposing surfaces of piezoelectric material 112, and then electrodes 114 may be subsequently electrically coupled to the protective material. For example, the protective material may be a copper-clad laminate, such as Espanex available from Nippon Steel Chemical Co., Ltd. (Tokyo, JP). An electrically conductive pad 116 may be electrically coupled to (e.g., by direct physical contact with) each of the electrodes 114, and an electrically conductive lead 118 (e.g., wire) may be electrically coupled to (e.g., by direct physical contact with) each of the conductive pads 116.

Fluid-flow, such as airflow (e.g., wind) or water-flow (e.g., flowing water currents in oceans, tides, rivers, lakes, and manmade channels or conduits, etc), impacting (e.g., flowing over) generator 100 produces an alternating vibratory motion in generator 100 (e.g., causes generator 100 to vibrate). For example, generator 100 may be configured to vibrate in response to a fluid flowing thereover. The piezoelectric material 112 is configured to generate an alternating electrical charge (e.g., an AC voltage) in response to generator 100 vibrating.

For water applications, generator 100 may be submerged within a body of water, such as a river, ocean, lake, or a manmade channel, etc. For other embodiments, the fluid-flow may be produced by moving generator 100 through a relatively stationary fluid. For example, generator 100 form a portion of a vehicle, such as a ground or aerial (manned or unmanned) motor vehicle, e.g., an automobile, airplane, etc., or a marine or submarine (manned or unmanned) motor vehicle, e.g. a boat, submarine, etc.

Figure 3:
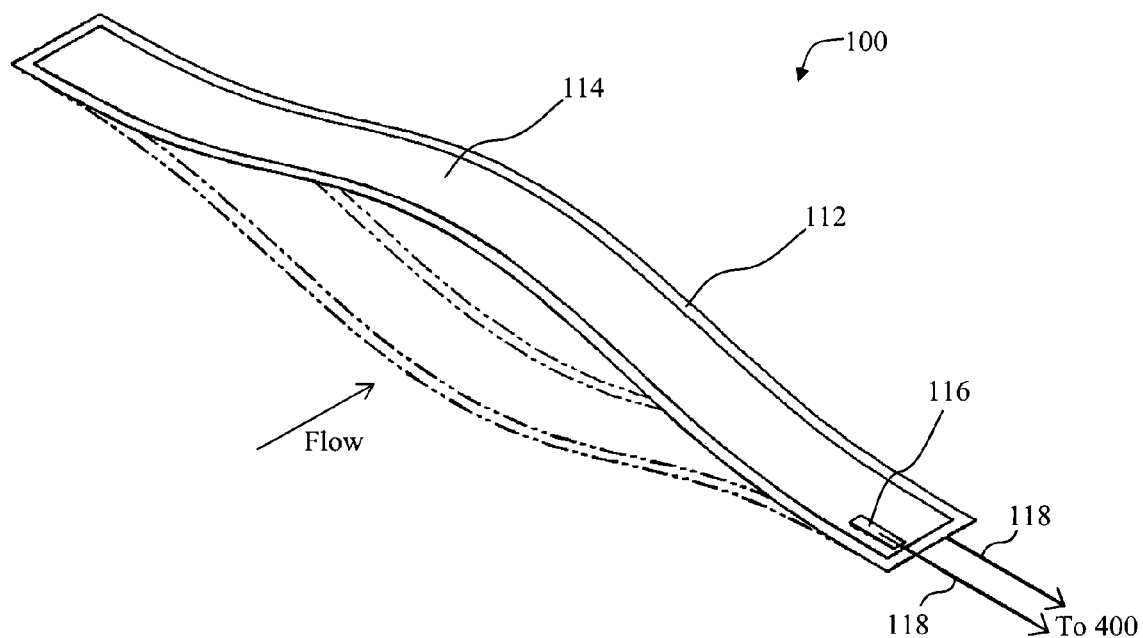
FIG. 3 is an example of a first bending mode of a generator, according to another embodiment.

The alternating vibratory motion of generator 100 induces alternating bending (e.g., FIG. 3 for a first bending mode) and/or alternating torsion, and subsequent alternating bending strain and/or alternating torsional strain in generator 100. The strain alternately reduces the thickness of piezoelectric material 112, inducing alternating stress in the piezoelectric material and producing an alternating electrical charge. The alternating vibratory motion of generator 100 produces an AC voltage AC, and thus AC power, that may be output via leads 118. Note that the frequency of the AC voltage $V_{AC}$ may be substantially the frequency of vibration of generator 100.

The vibration characteristics, such as the frequency of vibration and the displacement, of generator 100 may be controlled by one or more control parameters, such as one or more boundary constraints imposed of generator 100, the tension of generator 100, and/or distribution of mass on generator 100. The control parameters may be passively controlled, in which case the vibration characteristics may be passively controlled for some embodiments. Alternatively, the control parameters may be actively controlled, in which case the vibration characteristics may be actively controlled for other embodiments. For some embodiments, the control parameters may be controlled using a combination of passive and active control. Since the vibration characteristics may determine the power output of generator 100, the power output of generator 100 may be passively and/or actively controlled.

Leads 118 may direct the AC voltage $V_{AC}$ to a converter 400 (FIG. 4) to convert the AC voltage $V_{AC}$ to a DC voltage $V_{DC}$ for storage and/or for driving an electrical load. That is, convertor 400 may be electrically coupled to generator 100 for receiving the AC voltage $V_{AC}$ that is generated by piezoelectric material 112 from generator 100.

Converter 400 may include a rectifier 410 configured to rectify AC voltage $V_{AC}$ into a rectified AC voltage. For some embodiments, a smoother 420, such as a capacitive smoother, may receive the rectified AC voltage from rectifier 410 for smoothing the rectified AC into a DC voltage $V_{DC}$. The DC voltage $V_{DC}$, and associated DC electrical power, may then be output from smoother 420 and may be used directly for driving an electrical load and/or may be stored, e.g., in a battery. For some embodiments, a power conditioner (not shown) may receive the electrical power from smoother 420 and may be used to facilitate power transfer. Non-limiting examples of suitable power conditioners include the SVC LIGHT® with Energy Storage manufactured by ABB, Inc., Zurich, Switzerland and the E-FORCE® Air-Cooled Wind Inverter manufactured by Magnetek, Menomonee Falls, Wis., U.S.A.

For some embodiments, a generator 100 and a converter 400 may form a fluid power generation system, such as a wind-power generation system or kinetic hydropower generation system. The fluid power generation system may include a controller 450 (FIG. 4) that may be electrically coupled to leads 118 and may be configured to receive the AC voltage $V_{AC}$ and corresponding AC current from generator 100 via leads 118. For example, controller 450 may be electrically coupled to generator 100 for receiving an AC signal, e.g., the AC voltage $V_{AC}$ and/or corresponding AC current, generated by generator 100, e.g., generated by piezoelectric material 112, from generator 100.

Controller 450 may be configured to determine the AC power output from generator 100 from the AC voltage $V_{AC}$ and the AC current. Controller 450 may be further configured to determine the frequency of the AC voltage $V_{AC}$, and thus the frequency of vibration of generator 100 from the AC voltage $V_{AC}$. For some embodiments, controller 450 may be electrically coupled to one or more vibration sensors 140 (FIG. 1), such as accelerometers, physically coupled to generator 100, for receiving an electrical signal $SENS_{140}$ from the one or more vibration sensors 140 indicative of the frequency of vibration of generator 100.

Controller 450 may be electrically coupled to the DC output (e.g., DC current and voltage output) of converter 400 and may be configured to receive the DC voltage $V_{DC}$ and DC current from converter 400 and may be configured to determine the DC power output of convertor 400 from the DC voltage $V_{DC}$ and the DC current. Controller 450 may be electrically coupled to a flow sensor 150 configured to sense the flow rate (e.g., flow velocity) of the fluid in which generator 100 is located and that is flowing over generator 100, e.g., upstream of generator 100, as shown in FIG. 1, or away from generator 100, such as a free-stream flow rate. Controller 450 may be configured to receive an electrical signal $SENS_{150}$ from sensor 150 indicative of the flow rate of the fluid, e.g., the free-stream flow rate, in which generator 100 is located that is flowing over generator 100.

Controller 450 may be further configured to output one or more electrical signals S, e.g., electrical signals $S_1$-$S_M$. For some embodiments, the one or more electrical signals S may be used to adjust one or more vibration control parameters of generator 100, such as the tension of generator 100, a stiffness of one or more boundary constraints physically coupled to generator 100, e.g., one or more end boundary constraints and/or one or more side boundary constraints, and/or a distribution of mass on generator 100, for producing a particular power output. The one or more electrical signals S may be based on flow rate (e.g., flow velocity) of the fluid for a particular power output and/or may be based on an AC power input to controller from generator 100.

For example, controller 450 may be configured to receive an AC power input from generator 100, e.g., as feedback, to compare a value indicative of the received AC power input, e.g., the fed-back AC power, to a value indicative of a desired (e.g., a set-point) AC power, and to send one or more electrical signals S for adjusting the tension of generator 100, the stiffness of boundary constraints, and/or the mass distribution in response to the value indicative of the received AC power input and the value indicative of the desired of AC power differing by at least a certain amount.

Controller 450 may be further configured to determine particular frequencies, such as substantially the resonant frequencies of generator 100, for different flow rates at particular power outputs (AC or DC), e.g., where values corresponding to the particular power outputs may be input to controller by a user or may programmed in controller 450, e.g., as set-point values. For example, controller 450 may include a look-up table 465 that includes the particular frequencies versus the flow rate at each of the particular power outputs. Controller 450 may be configured to retrieve a particular frequency from look-up table 465 for a given flow rate at a particular power output. Alternatively, controller 450 may compute a particular frequency from a mathematical formula that relates the particular frequency to the flow rate for each of the particular power outputs. Controller 450 may then output one or more signals S for adjusting the vibration control parameter values of generator 100 so that generator 100 vibrates at substantially the particular frequency and thus generates substantially the particular power.

Controller 450 may be configured to receive a signal indicative of the frequency of vibration of generator 100, e.g., the signal $SENS_{140}$ or the AC voltage $V_{AC}$, e.g., as feedback, may be configured to compare a value indicative of the received frequency to a value indicative of a desired (e.g., a set-point) frequency, and may be configured to further adjust the vibration control parameter values of generator 100 in response to the value indicative of the received frequency and the value indicative of the desired frequency differing by at least a certain amount.

Figure 5:
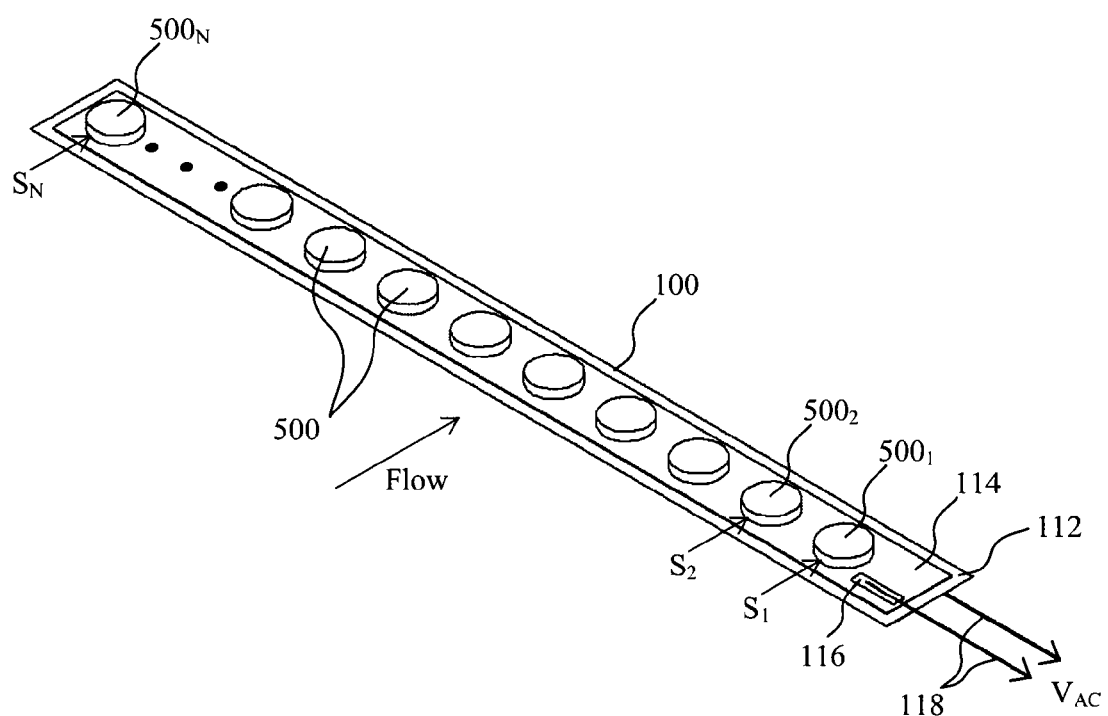
FIG. 5 illustrates a generator having a plurality of masses thereon, according to another embodiment.

For other embodiments, one or more masses 500, such as masses $500_1$ to $500_N$ may be respectively located at one or more locations (e.g., vibration antinodes) on an upper surface of generator 100, as shown in FIG. 5. Locating the masses 500 at antinodes may act to control the frequency (e.g., substantially the resonant frequency), the mode of vibration of generator 100, and the displacement of generator 100, and thus the power output of generator 100. For example, the N masses in FIG. 5 may act to produce the Nth mode of vibration of generator 100.

Masses 500 may be passive masses or active masses. For example, active masses 500 may be shape memory materials. Non-limiting examples of shape memory materials include copper-zinc-aluminium-nickel, copper-aluminium-nickel, nickel-titanium (NiTi), etc. Shape memory materials have the ability to return to their original shapes through a phase transformation that can take place by inducing heat in the shape memory materials. When a shape memory material is below its transformation temperature, it has very low yield strength and can be easily deformed into a new shape (which it will retain). However, when a shape memory material is heated, e.g. by passing an electrical current therethrough, above its transformation temperature, it will return to the original shape. Masses 500 whose shapes cannot be substantially changed may be referred to as passive masses.

When using active masses 500, the vibration frequency and the displacement of generator 100, and thus the power output (AC or DC) of generator 100, may be adjusted by changing the shapes of one or more of masses 500, and thus the mass distribution on generator 100. For some embodiments, active masses $500_1$ to $500_N$ may be electrically coupled to controller 450 for respectively receiving signals $S_1$ to $S_N$ therefrom. For example, each of signals $S_1$ to $S_N$ may be an electrical current.

In response to receiving electrical signal $SENS_{150}$ from sensor 150 indicative of a flow rate, controller 450 may output one or more signals $S_1$ to $S_N$ to respective ones of one or more of active masses 500, causing them heat and thus to change shape. Controller 450 may be configured to determine which of the active masses 500 receives the a signal based on the flow rate and a desired power output, where a value corresponding to the desired power output is either input to controller 450 by a user or is preprogrammed into controller 450. For example, controller 450 may include a look-up table 470 that specifies which of the active masses 500 are to receive a signal versus the flow velocity at each of a plurality of power outputs. Adjusting the shape of active masses 500 to control the frequency, displacement, and power output is an example of actively controlling the frequency, displacement, and power output. Using passive masses 500 to control the frequency, displacement, and power output is an example of passively controlling the frequency, displacement, and power output.

Figure 6:
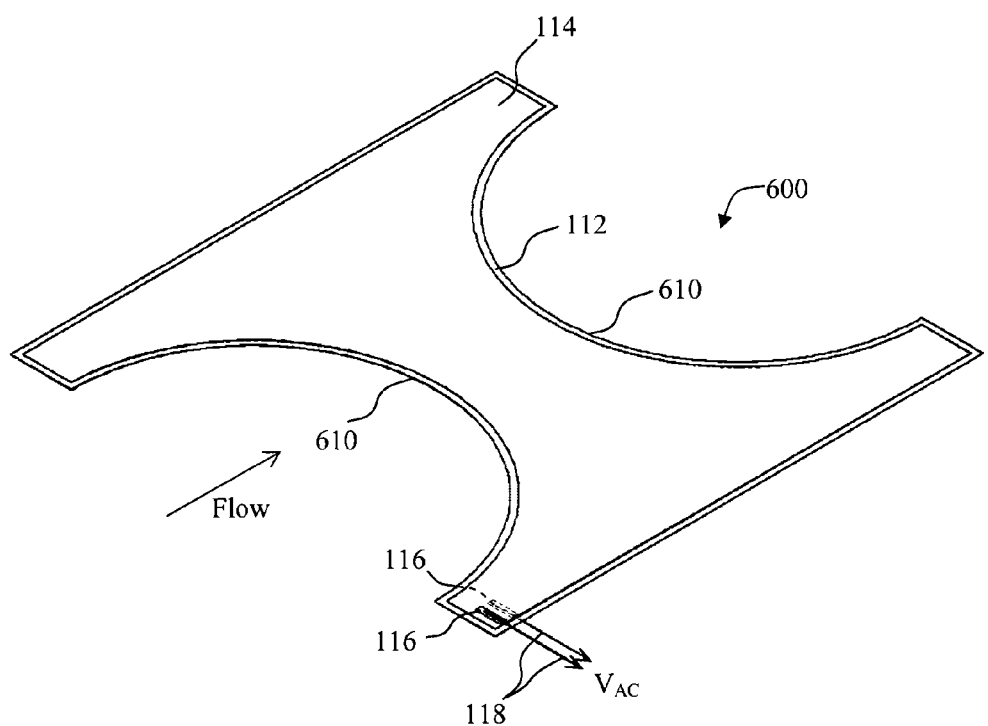
FIG. 6 illustrates a generator of another shape, according to another embodiment.

For some embodiments, the vibration characteristics of a generator may be changed by changing the shape of that generator, as shown in FIG. 6 for a generator 600, where common numbering is used in FIGS. 1 and 6 to denote substantially similar (e.g., the same components). For example, the change in shape may alter the strain distribution in the generator and in piezoelectric material 112, and thus the power output of the generator.

At least a portion of sides 610 of generator 600 may be curved. For example, the curvature in sides 610 may be substantially semicircular. For example, generator 600 may have substantially semicircular notches formed in the sides 610. For one embodiment, generator 600 may be formed by forming substantially semicircular notches formed in the sides of generator 100.

The electrical leads 118 direct AC voltage $V_{AC}$, and thus AC power, generated by generator 600 to converter 400 (FIG. 4) to convert the AC voltage $V_{AC}$ to the DC voltage $V_{DC}$, and thus DC power, for storage and/or for driving an electrical load, as described above in conjunction with FIGS. 1 and 4. The AC voltage $V_{AC}$ and the DC voltage $V_{DC}$ may be sent to controller 450. One or more vibration sensors, such as one or more vibration sensors 140 (FIG. 1), may be coupled to generator 600, for outputting electrical signals $SENS_{140}$ to controller 450. One or more masses 500 may be located at different locations on an upper surface of generator 600 (not shown in FIG. 6), and may be actively controlled by controller 450 to adjust the mass distribution, as described above in conjunction with FIGS. 4 and 5.

Figure 7:
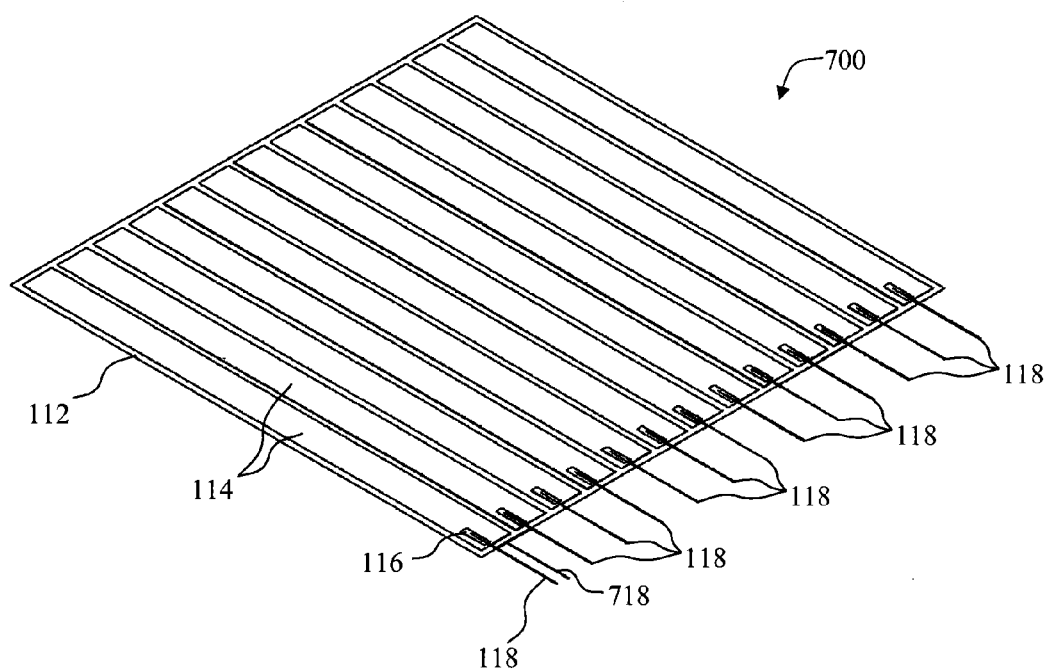
FIG. 7 is a top isometric view of a generator having a plurality of electrodes on one side and a single electrode on an opposite side, according to another embodiment.
Figure 8:
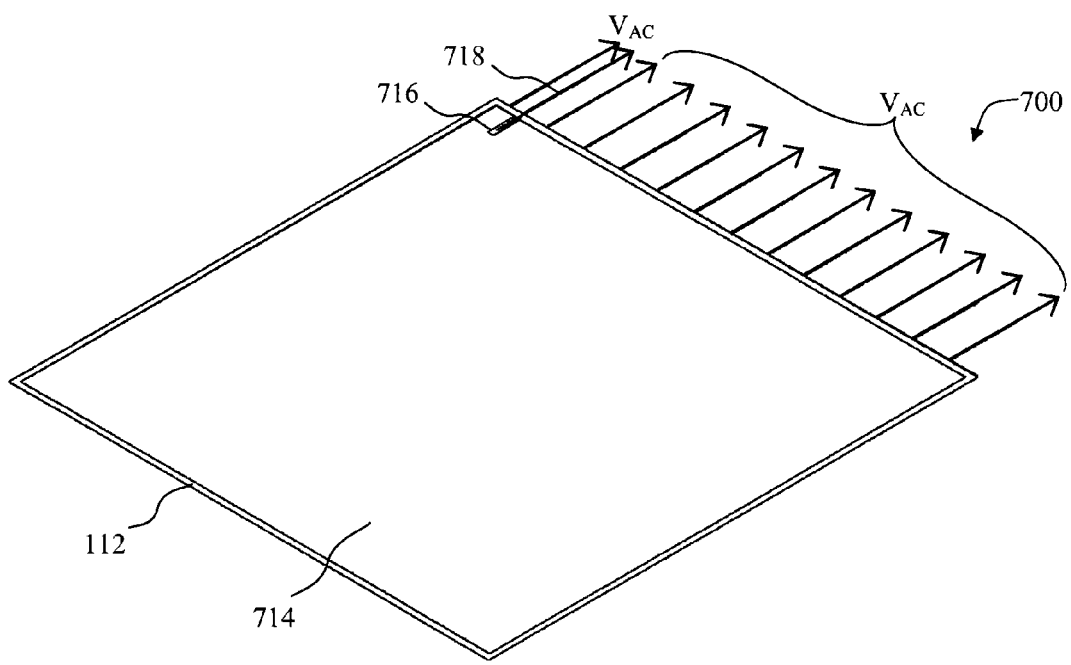
FIG. 8 is a bottom isometric view of the generator in FIG. 7, according to another embodiment.

FIGS. 7 and 8 are respectively top and bottom isometric views illustrating a generator 700, where common numbering is used in FIG. 1 and FIGS. 7 and 8 to denote substantially similar (e.g., the same components). Generator 700 may include piezoelectric material 112. A plurality of individual, separated electrodes 114 may be electrically coupled to (e.g., by direct physical contact with) a surface of piezoelectric material 112, as shown in FIG. 7. A single, e.g., continuous, electrode 714 may be electrically coupled to (e.g., by direct physical contact with) an opposite surface of piezoelectric material 112, as shown in FIG. 8.

An electrically conductive pad 116 may be respectively electrically coupled, one-to-one, to (e.g., by direct physical contact with) electrodes 114, and an electrically conductive lead 118 may be electrically coupled to (e.g., by direct physical contact with) each of the conductive pads 116. A single electrically conductive pad 716 may be electrically coupled to (e.g., by direct physical contact with) the single electrode 714, and an electrically conductive lead 718 may be electrically coupled to (e.g., by direct physical contact with) electrode 714.

One or more active or passive masses 500 may be located at different locations on an upper surface of generator 700 (not shown in FIGS. 7 and 8). The active masses 500 may be actively controlled by controller 450 to adjust the mass distribution, as described above in conjunction with FIGS. 4 and 5.

Each of electrical leads 118 and electrical lead 718 may direct an AC voltage $V_{AC}$, and thus AC power, generated by generator 700 to converter 400 (FIG. 4) to convert the AC voltage $V_{AC}$ to a DC voltage $V_{DC}$, and thus DC power, for storage and/or for driving an electrical load, as described above in conjunction with FIGS. 1 and 4. Note that each of the portions of piezoelectric material 112 respectively corresponding to (e.g., in direct physical contact with) electrodes 114 may generate AC voltage $V_{AC}$, and thus AC power. These AC voltages, and thus AC powers, may add to each other for output to converter 400. The AC voltage $V_{AC}$ and the DC voltage $V_{DC}$ may be sent to controller 450. One or more vibration sensors, such as one or more vibration sensors 140 (FIG. 1), may be coupled to generator 700, for outputting electrical signals $SENS_{140}$ to controller 450.

Figure 9:
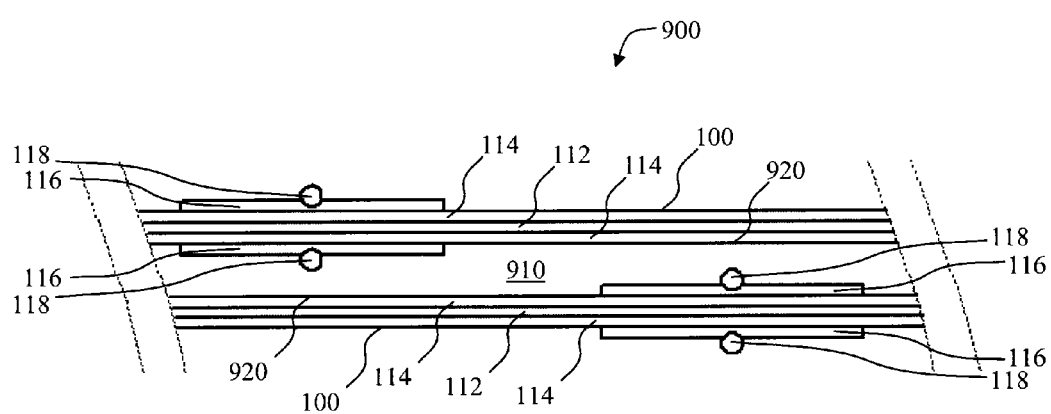
FIG. 9 is a cross-sectional view showing generators on opposite sides of a substrate, according to another embodiment.
Figure 10:
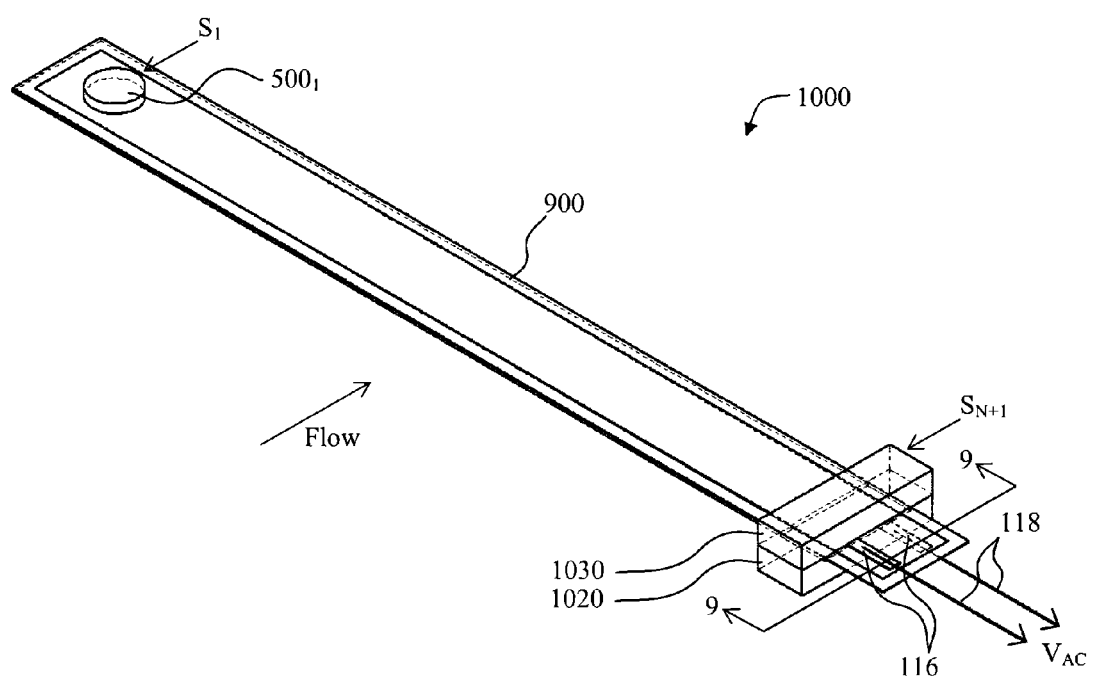
FIG. 10 illustrates a fluid power generation system having a cantilevered generator, according to another embodiment.

FIG. 9 is a cross-sectional view (with cross-hatching omitted for clarity) of a generator 900, e.g., as a portion of a fluid power generation system 1000, taken along line 9-9 of FIG. 10, where common numbering is used in FIGS. 1 and 9 to denote substantially similar (e.g., the same components). Generator 900 may include, for some embodiments, a substrate 910, e.g., made of steel, alloys of steel, aluminum, alloys of aluminum, plastic, carbon fiber, ceramics, wood, etc. A generator 100, e.g., as a generator component (e.g., module) of generator 900, may be located on one or on both of opposing surfaces 920 of substrate 910. For other embodiments, a generator 600 or a generator 700, e.g., as a generator component (e.g., module) of generator 900, may be located on one or on both of opposing surfaces 920.

The presence of substrate 910 acts to increase the distance between an upper surface of piezoelectric material 112 and a neutral axis of generator 900, increasing the strain, and thus the voltage and power outputs, of piezoelectric material 112. Leads 118 may direct an AC voltage $V_{AC}$, and thus AC power, generated by generator 900 to converter 400 (FIG. 4) to convert the AC voltage to a DC voltage $V_{DC}$, and thus DC power, for storage and/or for driving an electrical load, as described above in conjunction with FIGS. 1 and 4. The AC voltage $V_{AC}$ and the DC voltage $V_{DD}$ may be sent to controller 450. One or more vibration sensors, such as one or more vibration sensors 140 (FIG. 1), may be coupled to generator 900, for outputting electrical signals $SENS_{140}$ to controller 450.

Generator 900 may be cantilevered, as shown in FIG. 10. One or more active or passive masses 500 (e.g., mass $500_1$, as shown in FIG. 10) may be located at different locations on an upper surface of generator 900. The active masses may be actively controlled by controller 450 to adjust the mass distribution, as described above in conjunction with FIGS. 4 and 5. For example, active mass $500_1$ may receive signal $S_1$ from controller 450 for changing the shape of active mass $500_1$.

Generator 900 may be between (e.g. clamped between) a support structure 1020 and a boundary constraint 1030 adjacent to an end of generator 900. Boundary constraint 1030 may be a passive stiffness element, such as a spring or a substantially rigid material, or an active stiffness element, such as a piezoelectric stiffness element configured to exert a force on generator 900 or a spring made from shape memory material. The active stiffness element may be coupled to controller 450 for receiving an electrical signal, such as electrical signal $S_{N+1}$ from controller 450.

In the case of a piezoelectric stiffness element, the electrical signal $S_{N+1}$ may be a variable voltage. Applying different voltages to a piezoelectric stiffness element causes the piezoelectric stiffness element to exert different forces on generator 900 that act to produce different stiffness.

In the case of a shape memory material spring, the electrical signal $S_{N+1}$ may be current. Applying a current, in one embodiment, to shape memory material spring may heat the spring past its transition temperature, causing the spring constant, and thus the stiffness, to increase by about a factor of ten, for example. For example, heating a shape memory material to a temperature above its transformation temperature will increase its stiffness to above its stiffness when the temperature of the shape memory material is below the transformation temperature. The stiffness of a shape memory material can be controlled with an electrical current.

Controller 450 may send signal $S_{N+1}$ to adjust the stiffness at boundary constraint 1030 and/or signal $S_1$ to adjust the mass distribution based on the signal $SENS_{150}$ indicative of the flow rate so that fluid power generation system 1000 outputs a desired power, e.g., that may be input to controller 450 by a user or may be preprogrammed in controller 450. That is, adjusting the stiffness of boundary constraint 1030 and/or the mass distribution adjusts the vibration characteristics, e.g., vibration frequency of generator 900 and/or the displacement of generator 900. This adjusts the strain and thus the power output of generator 900.

Figure 11:
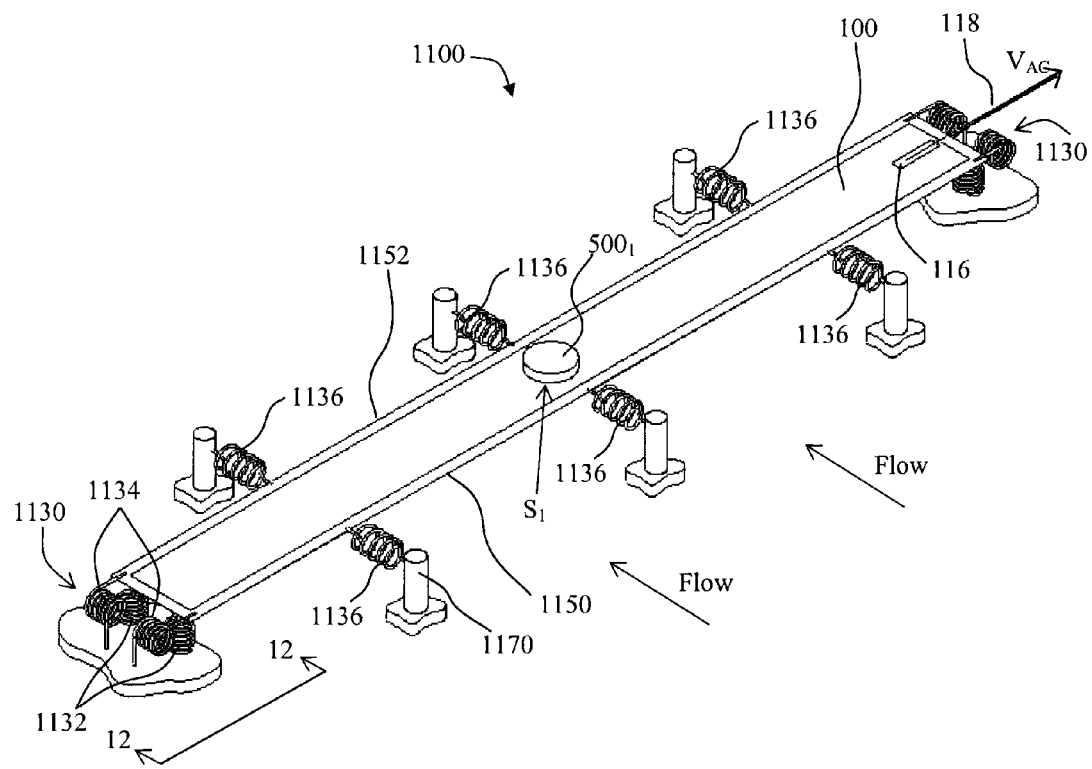
FIG. 11 illustrates a fluid power generation system having a generator coupled to a plurality of boundary constraints, according to another embodiment.

FIG. 11 illustrates a fluid power generation system 1100. Fluid power generation system 1100 may include a generator, such as generator 100, as shown in FIG. 11, generator 600, generator 700, or generator 900. For example, although the following example of fluid power generation system 1100 will be discussed in terms of generator 100, it will be appreciated that generator 100 can be replaced by generator 600, 700, or 900.

Opposing ends of generator 100 are respectively physically coupled to end boundary constraints 1130 so that generator 100 extends from one boundary constraint 1130 to the other end boundary constraint 1130. For example, one of end boundary constraints 1130 may be physically coupled to piezoelectric material 112 adjacent to one of its ends and another one of end boundary constraints 1130 may be physically coupled to piezoelectric material 112 adjacent to the other one of its ends.

Figure 4:
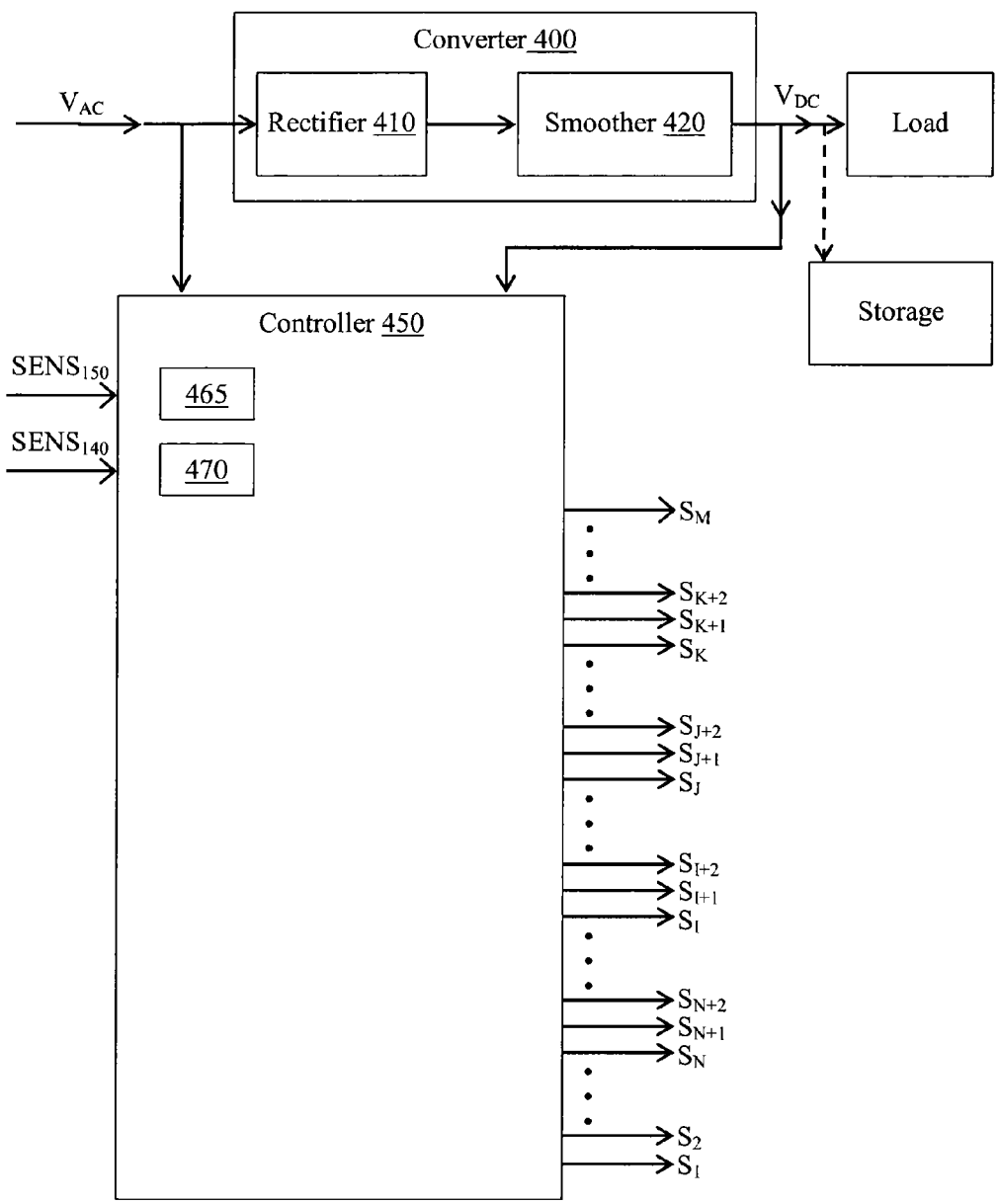
FIG. 4 illustrates a converter and a controller as a portion of a fluid power generation system, according to another embodiment.

For some embodiments, at least one of the end boundary constraints 1130 may be an active boundary constraint. For other embodiments, both of the end boundary constraints 1130 may be active boundary constraints. Each active boundary constraint 1130 may be electrically coupled to controller 450 for receiving electrical signals from controller 450, such as one or more of signals $S_{N+1}$ to $S_1$ (FIG. 4) and/or one or more of signals $S_{I+1}$ to $S_J$ (FIG. 4). Any non-active boundary constraint 1130 is a passive boundary constraint 1130. For other embodiments, both of the end boundary constraints 1130 may be passive boundary constraints.

Figure 12:
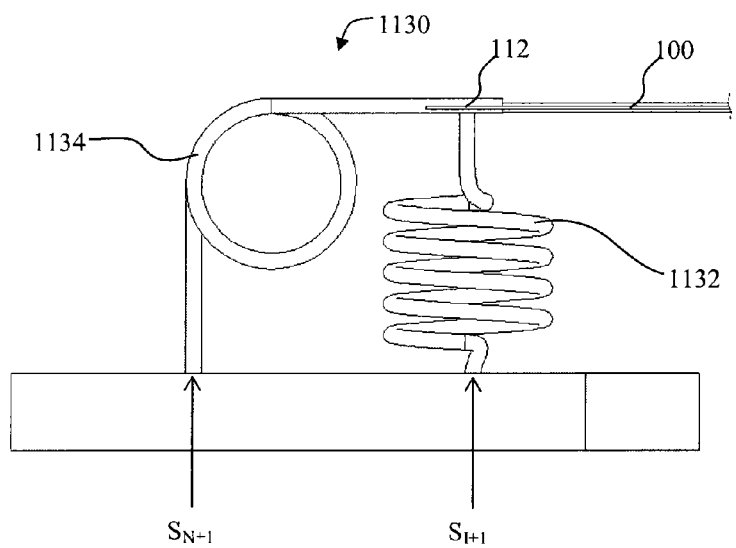
FIG. 12 is an enlarged view, taken along line 12-12 in FIG. 11, according to another embodiment.

End boundary constraints 1130 affect the substantially planar bending of generator 100. For example, different end boundary constraints 1130 change the substantially planar bending, and thus the substantially planar vibration of generator 100. Each of the end boundary constraints 1130 may include one or more end translational stiffness elements 1132 and/or one or more end torsional stiffness elements 1134, as shown in FIG. 11 and FIG. 12 an enlarged view, taken along line 12-12 in FIG. 11, of an end of fluid power generation system 1100. For some embodiments, the end torsional and/or end translational stiffness elements may be active and may include shape memory material or piezoelectric material.

The stiffness of the end translational stiffness elements 1132 affects the displacement of generator 100 adjacent to the respective ends of generator 100. One or more of the end translational stiffness elements 1132 may be passive end translational stiffness elements, such as translational springs, e.g., coil springs, or active end translational stiffness elements, such as piezoelectric translational stiffness elements or shape-memory translational springs, e.g., coil springs, made from shape memory material. For some embodiments, the end translational stiffness elements 1132 adjacent to one of the ends of generator 100 may be passive, whereas the end translational stiffness elements 1132 adjacent to the other of the ends of generator 100 may be either passive or active. For other embodiments, the end translational stiffness elements 1132 adjacent to both of the ends of generator 100 may be active.

The stiffness of the end torsional stiffness elements 1134 affects the slope of generator 100, and thus the moment, adjacent to the respective ends of generator 100. One or more of the end torsional stiffness elements 1134 may be passive end torsional stiffness elements, such as torsional springs, or active end torsional stiffness elements, such as piezoelectric torsional stiffness elements or shape-memory torsional springs made from shape memory material. For some embodiments, the end torsional stiffness elements 1134 adjacent to one of the ends of generator 100 may be passive, whereas the end torsional stiffness elements 1134 adjacent to the other of the ends of generator 100 may be either passive or active. For other embodiments, the end torsional stiffness elements 1134 adjacent to both of the ends of generator 100 may be active.

The active end translational stiffness elements may be electrically coupled to controller 450 for respectively receiving signals $S_{N+1}$ to $S_1$ (FIG. 4) from controller 450 for adjusting the stiffness of the active end translational stiffness elements. The active end torsional stiffness elements may be electrically coupled to controller 450 for respectively receiving signals $S_{I+1}$ to $S_J$ (FIG. 4) from controller 450 for adjusting the stiffness of the active end stiffness torsional elements. For example, an end translational stiffness element 1132 may receive signal $S_{N+1}$ and an end torsional stiffness element 1134 may receive a signal $S_{I+1}$, as shown in FIG. 12. Adjusting the active end torsional and/or end translational stiffness elements controls the planar bending and planar vibration of generator 100.

Side boundary constraints, such as side stiffness elements 1136, may be physically coupled to opposing sides of generator 100, e.g., the leading edge 1150 and the trailing edge 1152 of generator 100 with regard to the fluid flow, and may be passive or active. The stiffness of side stiffness elements 1136 impacts the out-of-plane (e.g., torsional) bending, e.g., twisting, of generator 100. For some embodiments, each side stiffness element 1136 may extend from a side of generator 100 to a support 1170, such as a slender rod, e.g., having a diameter that is much less than the distance from one end of generator 100 to the opposite end of generator 100 so as not to substantially effect the fluid flow at the leading edge 1150.

One or more of the side boundary constraints, e.g., side stiffness elements 1136, may be either passive or active, where an active side boundary constraint may include piezoelectric material or shape memory material. For some embodiments, the side boundary constraints physically coupled to one of the sides of generator 100 may be passive, whereas the side boundary constraints physically coupled to the other of the sides of generator 100 may be either passive or active. For other embodiments, the side boundary constraints physically coupled to both of the sides of generator 100 may be active. The active side boundary constraints may be electrically coupled to controller 450 for receiving electrical signals, such as electrical signals $S_{J+1}$ to $S_K$ (FIG. 4), from controller 450.

An example of passive side stiffness elements 1136 may include springs, while an example of active side stiffness elements 1136 may include piezoelectric stiffness elements or shape-memory springs made from shape memory material. The active side stiffness elements 1136 may be electrically coupled to controller 450 for respectively receiving signals $S_{J+1}$ to $S_K$ (FIG. 4) from controller 450 for adjusting the stiffness of the active side stiffness elements 1136.

For one embodiment, one or more passive or active masses 500 (e.g., mass $500_1$, as shown in FIG. 11, or masses $500_1$ to $500_N$, as shown in FIG. 5) may be located at different locations on an upper surface of generator 100. The active masses 500 may be actively controlled by controller 450 to adjust the mass distribution, as described above in conjunction with FIGS. 4 and 5. For example, active mass $500_1$ may receive signal $S_1$ from controller 450 for changing the shape of active mass $500_1$. For some embodiments, fluid power generation system 1100 may include all active masses, all passive masses, or a combination of passive and active masses, all active end translational stiffness elements, all passive end translational stiffness elements, or a combination of passive and active end translational stiffness elements, all active end torsional stiffness elements, all passive end torsional stiffness elements, or a combination of passive and active end torsional stiffness elements, and all active side stiffness elements, all passive side stiffness elements, or a combination of passive and active end translational stiffness elements.

Controller 450 may send one or more of the signals $S_{N+1}$ to $S_I$ (FIG. 4) to respective ones of one or more of the active end translational stiffness elements 1132, one or more of the signals $S_{I+1}$ to $S_J$ (FIG. 4) to respective ones of one or more of the active end torsional stiffness elements 1134, one or more of the signals $S_{J+1}$ to $S_K$ (FIG. 4) to respective ones of one or more of the active side stiffness elements 1136, and/or one or more of the signals $S_1$ to $S_N$ (FIG. 4) to respective ones of one or more of active masses $500_1$ to $500_N$ (FIG. 5), e.g., signal $S_1$ may be sent to active mass $500_1$ in FIG. 11.

The signals may be based on the signal $SENS_{150}$ indicative of the flow rate so that fluid power generation system 1100 outputs a desired power, e.g., that may be input to controller 450 by a user or may be preprogrammed in controller 450. For example, adjusting the stiffness of end boundary constraints 1130, the side boundary constraints, and/or the mass distribution adjusts the vibration characteristics, e.g., the vibration frequency of generator 100 and/or the displacement of generator 100. This adjusts the strain and thus the power output of generator 100.

Figure 13:
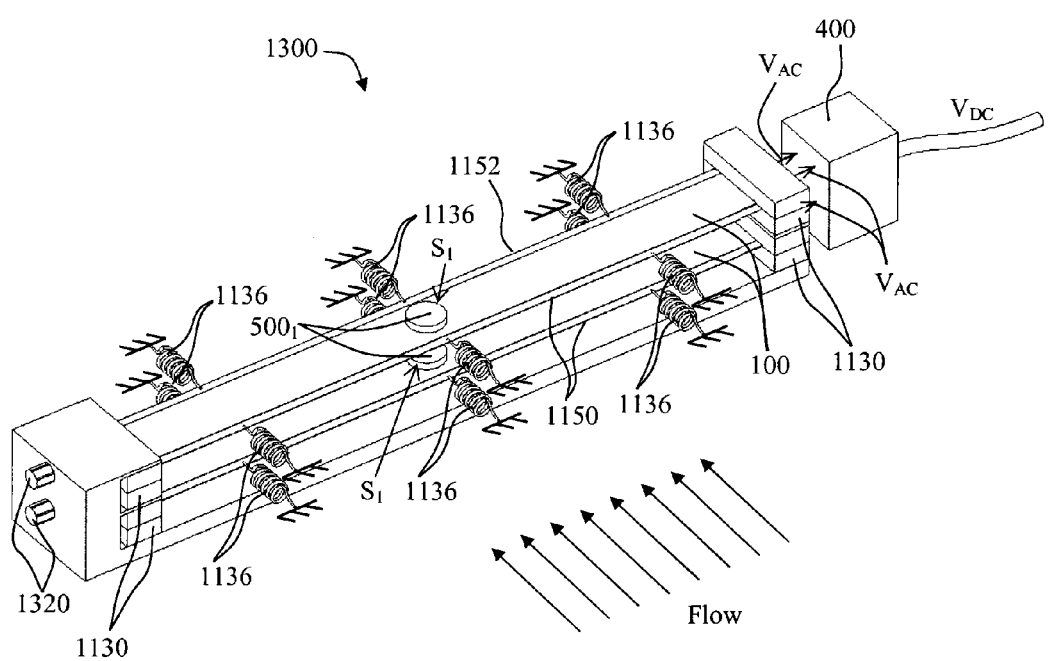
FIG. 13 illustrates a fluid power generation system having a plurality of generators, according to another embodiment.

FIG. 13 illustrates a fluid power generation system 1300 that may include a plurality of generators, such as generators 100. For example, fluid power generation system 1300 may include a stack, such as a substantially vertical stack (e.g., a vertical stack) of generators 100, so that one of the generators 100 is located above the other generator 100 in the stack. Although the following example of fluid power generation system 1300 will be discussed in terms of generator 100, it will be appreciated that each generator 100 can be replaced by generator 600, 700, or 900. Common numbering is used in FIGS. 13 and 11 to denote substantially similar (e.g., the same components).

Fluid power generation system 1300 includes a support structure, such as a frame. Opposing ends of each generator 100 are respectively coupled to end boundary constraints 1130 that are coupled to support structure 1310 so that each generator 100 extends from one boundary constraint 1130 to the other end boundary constraint 1130. That is, generators 100 of the plurality of generators 100 are coupled one-to-one to a pair of end constraints 1130.

End constraints 1130 were described above in conjunction with FIGS. 11 and 12. That is, for some embodiments, each of the end boundary constraints 1130 may include one or more end translational stiffness elements 1132 that may be passive or active and/or one or more end torsional stiffness elements 1134 that may be passive or active, as shown in FIG. 11 and FIG. 12. Side boundary constraints, such as side stiffness elements 1136 (e.g., as described above in conjunction with FIG. 11), may be coupled to one or both of opposing sides of each generator 100, e.g., the leading edge 1150 and/or the trailing edge 1152 of each generator 100, and may be passive or active. For some embodiments, one or more passive or active masses 500 (e.g., mass $500_1$, as shown in FIG. 13, or masses $500_1$ to $500_N$, as shown in FIG. 5) may be located at different locations on an upper surface of each generator 100 or on at least one of the plurality of generators 100.

Figure 14:
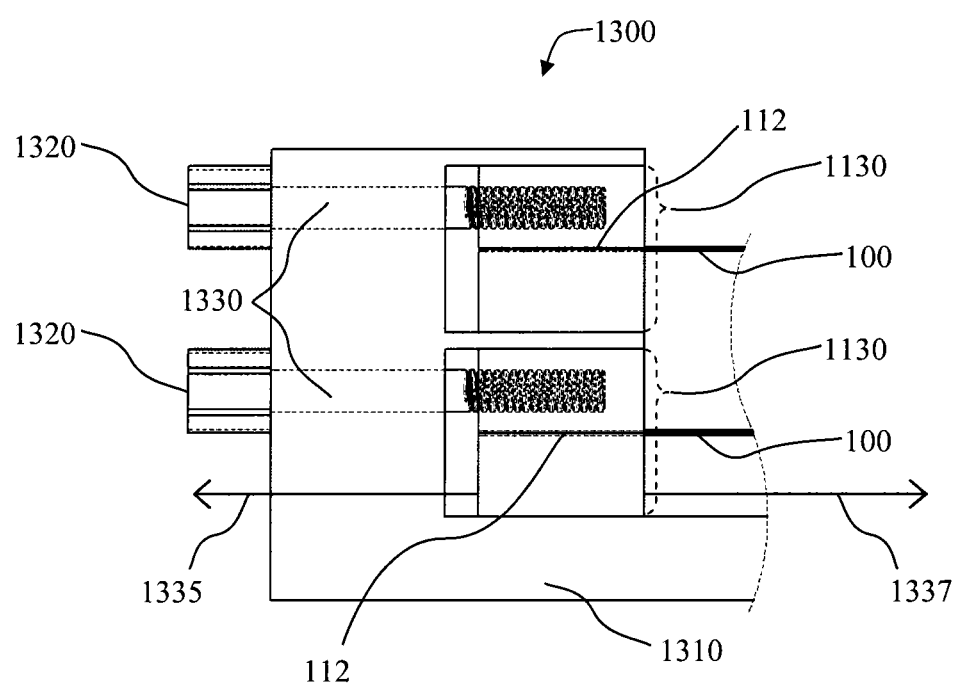
FIG. 14 illustrates an embodiment of a tension adjuster for adjusting tension in a generator, according to another embodiment.
Figure 15:
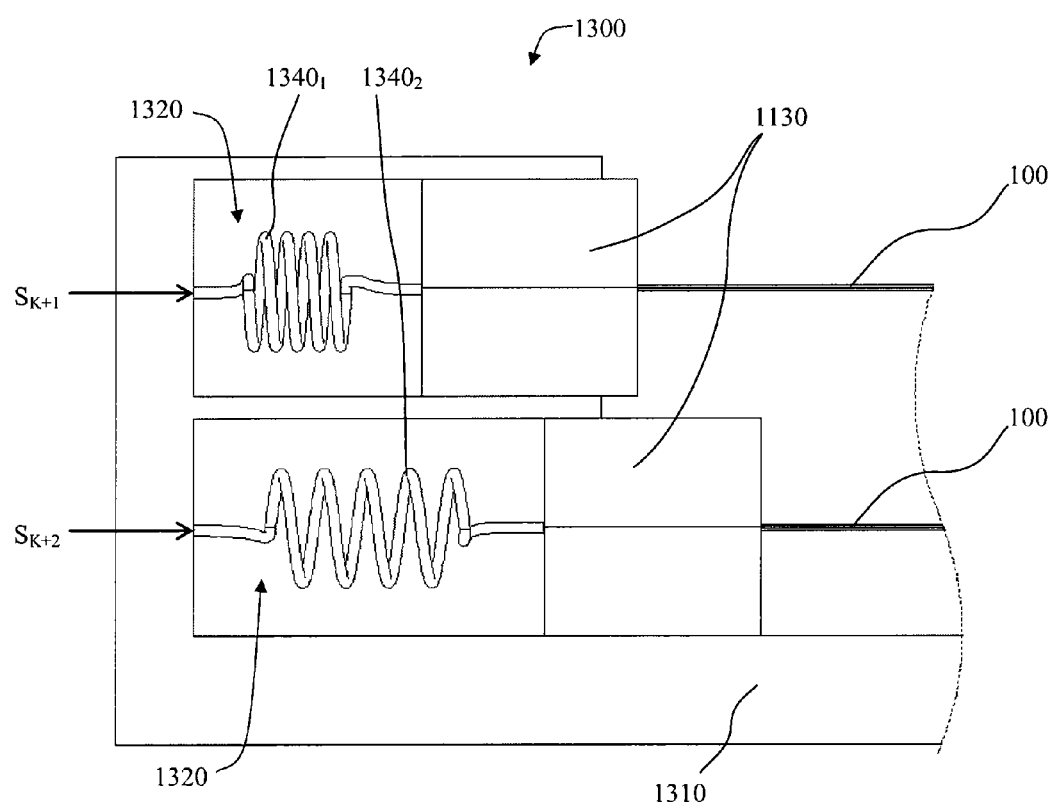
FIG. 15 illustrates another embodiment of a tension adjuster for adjusting tension in a generator, according to another embodiment.

Fluid power generation system 1300 may include a plurality of tension adjustors 1320. Tension adjusters 1320 may respectively correspond, one-to-one, to the generators 100 of fluid power generation system 1300, as shown in FIG. 13. Tension adjusters 1320 may be physically coupled to one end of the piezoelectric material of respective ones of generators 100, and thus to one end of the respective ones of generators 100, as shown in FIG. 14. For example, tension adjusters 1320 may be physically coupled to respective ones of the end boundary constraints 1130, as shown in FIGS. 14 and 15. Tension adjusters 1320 may be passive or active, where an active tension adjuster may include piezoelectric material or shape memory material.

An example of a passive tension adjuster 1320 may be a screw 1330 threaded into each of the end constraints 1130 coupled to one end of respective ones of the generators 100, and thus the respective ones of the generators 100, as shown in FIG. 14. Turning a respective screw 1330 in one direction causes a corresponding end constraint 1130 to move, e.g., relative to support structure 1310, in a direction away from the end constraint 1130 at the opposite end of the corresponding generator 100, as indicated by arrow 1135 in FIG. 14, thereby stretching, and thus increasing the tension in, the corresponding generator 100. Turning the respective screw 1330 in the opposite direction causes the corresponding end constraint 1130 to move, e.g., relative to support structure 1310, in a direction toward the end constraint 1130 at the opposite end of the corresponding generator 100, as indicated by arrow 1137 in FIG. 14, thereby decreasing the tension in the corresponding generator 100.

An example of an active tension adjuster 1320 may be a screw 1330 driven by a stepper motor (not shown), for example. The stepper motors may respectively correspond, one-to-one, to the generators 100 of fluid power generation system 1300 and may be electrically coupled to controller 450 for respectively receiving signals $S_{K+1}$ to $S_M$ from controller 450. The stepper motors may respectively turn the screws to adjust (e.g., increase or decrease) the tension in the respective generators 100, as described above, in response to respectively receiving signals $S_{K+1}$ to $S_M$ from controller 450.

Another example of a passive tension adjuster 1320 is a passive stiffness element 1340, such as a spring, as shown in FIG. 15. That is, stiffness elements $1340_1$ and $1340_2$ may be coupled one to one to the end constraints 1130 coupled to one end of respective ones of the generators 100 and thus coupled to respective ones of the generators 100. For example, stiffness elements $1340_1$ and $1340_2$ may have different spring constants so that they can exert different pulling forces on the respective end constraints 1130 to cause different tensions in the respective generators 100. For example, stiffness element $1340_1$ is exerting a larger pulling force on its respective end constraint 1130 than stiffness element $1340_2$ is exerting on its respective end constraint 1130, meaning that the tension in the generator 100 corresponding to stiffness element $1340_1$ is greater than the tension in the generator 100 corresponding to stiffness element $1340_2$. Note that the tension can be adjusted by using stiffness elements, e.g., springs, with different spring constants.

An example of an active stiffness element 1340, and thus an active tension adjuster 1320, is a stiffness element 1340 that includes shape-memory material or piezoelectric material. For example, stiffness elements $1340_1$ and $1340_2$ may be springs constructed shape-memory material or may be piezoelectric material configured to move end constraints 1130 for adjusting the tension in the corresponding generators 100. The active stiffness elements 1340 may be electrically coupled to controller 450 for respectively receiving signals $S_{K+1}$ to $S_M$ from controller 450 for respectively adjusting the tension in generators 100. For example, controller 450 may respectively send signals $S_{K+1}$ and $S_{K+1}$ to stiffness elements $1340_1$ and $1340_2$, as shown in FIG. 15.

Controller 450 may send one or more of the signals $S_{N+1}$ to $S_1$ (FIG. 4) to respective ones of one or more of the active end translational stiffness elements 1132 (FIG. 11) coupled to the ends of the respective generators 100, one or more of the signals $S_{I+1}$ to $S_J$ (FIG. 4) to respective ones of one or more of the active end torsional stiffness elements 1134 (FIG. 11) coupled to the ends of the respective generators 100, one or more of the signals $S_{J+1}$ to $S_K$ (FIG. 4) to respective ones of one or more of the active side stiffness elements 1136 coupled to the sides of the respective generators 100, one or more of the signals $S_1$ to $S_N$ (FIG. 4) to respective ones of one or more of active masses $500_1$ to $500_N$ (FIG. 5) located on the respective generators 100, and/or one or more of the signals $S_{K+1}$ to $S_M$ (FIG. 4) to respective ones of one or more of active stiffness elements 1340.

For some embodiments, different values of the one or more of the signals $S_1$ to $S_N$ may be respectively sent to the one or more of active masses $500_1$ to $500_N$ on different ones of the generators 100 of the plurality of generators 100. For example, different values of a signal $S_1$ may be sent to the respective masses $500_1$ on the respective ones of generators 100 in FIG. 13.

Different values of one or more of the signals $S_{N+1}$ to $S_1$ may be respectively sent to the one or more of the end translational stiffness elements 1132 coupled to the ends of different generators 100 of the plurality of generators 100. Different values of one or more of the signals $S_{I+J}$ to $S_J$ may be respectively sent to the one or more of the end torsional stiffness elements 1134 coupled to the ends of different generators 100 of the plurality of generators 100. Different values of one or more of the signals $S_{J+1}$ to $S_K$ may be respectively sent to the side stiffness elements 1136 coupled to the sides of different generators 100 of the plurality of generators 100. Different values of one or more of the signals $S_{K+1}$ to $S_M$ may be respectively sent to the active tension adjusters 1320 physically coupled to different generators 100 of the plurality of generators 100.

Each generator 100 may output an AC voltage $V_{AC}$, and thus AC power, generated by the respective generator 100 to converter 400 and to controller 450, e.g., in a manner similar to that described above in conjunction with FIGS. 1-5. Converter 400 may convert the sum of AC voltages from the respective generators 100 into a DC voltage $V_{DC}$, and a corresponding DC power, for storage and/or for driving an electrical load, as described above in conjunction with FIGS. 1 and 4. The DC voltage $V_{DC}$ may be sent to controller 450.

One or more vibration sensors, such as one or more vibration sensors 140 (FIG. 1), may be electrically coupled to each generator 100 and to controller 450, for outputting electrical signals $SENS_{140}$ to controller 450. Controller 450 may also receive an electrical signal $SENS_{150}$ from sensor 150 (FIG. 1) indicative of the flow rate of the fluid in which generators 100 are located and that is flowing over generators 100.

For some embodiments, all active masses, all passive masses, or a combination of passive and active masses, all active end translational stiffness elements may be located on each generator 100, all passive end translational stiffness elements, or a combination of passive and active end translational stiffness elements may physically coupled to each generator 100, all active end torsional stiffness elements, all passive end torsional stiffness elements, or a combination of passive and active end torsional stiffness elements may physically coupled to each generator 100, all active side stiffness elements, all passive side stiffness elements, or a combination of passive and active end translational stiffness elements may physically coupled to each generator 100, and all active tension adjusters, all passive tension adjusters, or a combination of passive and active tension adjusters may physically coupled to each generator 100.

For some embodiments, controller 450 may be electrically coupled to each of the generators 100 for receiving the AC voltage generated by the piezoelectric materials 112 of those generators 100 in response to those generators 100 vibrating when a fluid flows over those generators 100. Controller 450 may be further electrically coupled to at least one of an end boundary constraint 1130, a side boundary constraint 1136, a mass 500, and a tension adjuster 1320 for respectively sending electrical signals S thereto. The electrical signals S may cause the tension adjuster 1320 to adjust the tension in a respective one of generators 100, may adjust the stiffness of the end boundary constraint 1130 physically coupled to a respective one of generators 100, may adjust the stiffness of side boundary constraint 1136 physically coupled to a respective one of generators 100, and/or may adjust the mass distribution, e.g., by causing the mass 500 to change shape on a respective one of generators 100.

The controller 450 may be configured to send the respective signals S in response to receiving electrical signal $SENS_{150}$ from sensor 150 in order to adjust the tension, boundary constraint stiffness, and/or the mass distribution for each generator 100 corresponding to a particular, such as a desired (e.g., a set point), power generation for the respective generator 100. Controller 450 may be further configured to receive AC voltage $V_{AC}$ from the respective generator 100 and to determine the AC power (e.g., the actual AC power) generated by the respective generator 100, e.g., fed-back electrical power. Controller 450 may be further configured to compare the actual AC power generated by the respective generator 100 to the desired power generation for the respective generator 100. Controller 450 may be further configured to adjust respective signals S in order to adjust the tension, boundary constraint stiffness, and/or the mass distribution in response to the actual AC power generated by the respective generator and the desired power generation differing by more than a certain amount. For some embodiments, the controller may be configured to cause at least one of a stiffness of the boundary constraint, a distribution of the mass, and a tension exerted by the tension adjuster on the respective generator to be adjusted based on flow rate of a fluid in which generators 100, and thus fluid power generation system 1300, is located and/or a power generated by the respective generator.

Note that the fluid-flows herein may be airflows (e.g., wind) or water-flows (e.g., flowing water currents in oceans, tides, rivers, lakes, and manmade channels or conduits, etc.). For water applications, the generators and/or fluid power generation systems disclosed herein may be submerged within a body of water, such as a river, ocean, lake, or a manmade channel, etc. For other embodiments, the fluid-flows may be produced by moving the generators and/or fluid power generation systems disclosed herein through a relatively stationary fluid. For example, the generators and/or fluid power generation systems disclosed herein may form a portion of a vehicle, such as a ground or aerial (manned or unmanned) motor vehicle, e.g., an automobile, airplane, etc., or a marine or submarine (manned or unmanned) motor vehicle, e.g. a boat, submarine, etc.

For underwater applications, the generators and/or fluid power generation systems disclosed herein may be suitably waterproofed, e.g., polymer coated, to protect against electrical shorting and corrosion.

For some embodiments a fluid power generation system, such as any one of fluid power generation systems 1000, 1100, and 1300, may include a generator, such as generator 100, 600, 700, or 900, comprising an electrical-charge-producing material, such as piezoelectric material 112, that can produce an electrical charge when the generator vibrates in response to a fluid flowing over the generator, and at least one of a boundary constraint, such as end boundary constraint 1030, including piezoelectric or shape memory material, or end boundary constraint 1130, including one or more end translational stiffness elements 1132 and/or one or more end torsional stiffness elements 1134, a side boundary constraint, including one or more side stiffness elements 1136, physically coupled to the generator, a mass, such as one or more of masses 500, located on the generator, and a tension adjuster, such as tension adjuster 1320, physically coupled to an end of the generator, and a controller, such as controller 450, electrically coupled to the generator and to at least one of the at least one of the boundary constraint physically coupled to the generator, the mass located on the generator, and the tension adjuster physically coupled to the end of the generator.

Figure 16:
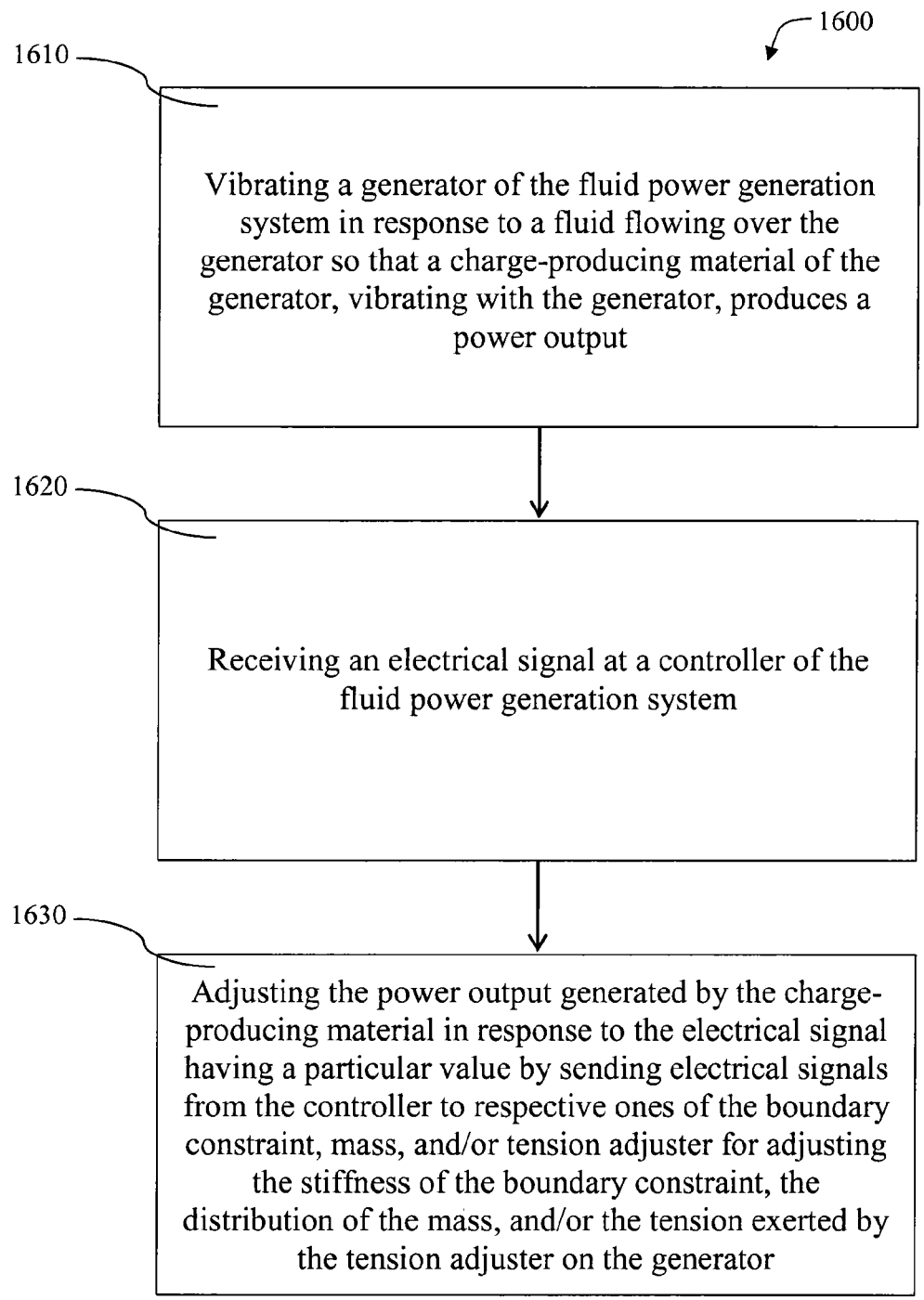
FIG. 16 is a flowchart of a method of operating a fluid power generation system, according to another embodiment.

FIG. 16 is flowchart of an example method 1600 of operating a fluid power generation system, such as any one of fluid power generation systems 1000, 1100, and 1300. Method 1600 includes vibrating a generator, such as generator 100, 600, 700, or 900, of the fluid power generation system in response to a fluid flowing over the generator so that a charge-producing material, such as piezoelectric material 112, of the generator, vibrating with the generator, produces a power output, at block 1610, where a boundary constraint, such as end boundary constraint 1030, including one or more end translational stiffness elements 1132 and/or one or more end torsional stiffness elements 1134, and/or a side boundary constraint, including one or more side stiffness elements 1136, is physically coupled to the generator, a mass, such as one of more masses 500, is located on the generator, and/or a tension adjuster, such as tension adjuster(s) 1320, is physically coupled to the generator. An electrical signal is received at a controller, such as controller 450, of the fluid power generation system at block 1620. The power output generated by the charge-producing material is adjusted in response to the electrical signal having a particular value, at block 1630, by sending electrical signals from the controller to respective ones of the boundary constraint, mass, and/or tension adjuster for adjusting the stiffness of the boundary constraint, the distribution of the mass, and/or tension exerted by the tension adjuster on the generator. For some embodiments, the particular value of the electrical signal may be indicative of a particular flow rate of the fluid flowing over the generator.

For other embodiments, the particular value of the electrical signal may be indicative of the power output produced by the charge-producing material. Method 1600 may further include comparing the particular value to a value indicative of a desired power output for the charge-producing material. For some embodiments, adjusting the power output generated by the charge-producing material in response to the electrical signal having a particular value occurs when the particular value differs from the value indicative of the desired power output for the charge-producing material by at least a certain amount.

CONCLUSION

Although specific embodiments have been illustrated and described herein it is manifestly intended that the scope of the claimed subject matter be limited only by the following claims and equivalents thereof.

What is claimed is:

1. A fluid power generation system, comprising:
a generator comprising an electrical-charge-producing material;
a pair of end boundary constraints; and
a side boundary constraint physically coupled to each of opposing sides of the generator;
wherein one of the end boundary constraints of the pair of end boundary constraints is physically coupled to the electrical-charge-producing material adjacent to an end of the electrical-charge-producing material and the other one of the pair of end boundary constraints is physically coupled to the electrical charge-producing material adjacent to an opposite end of the electrical-charge-producing material.

2. The fluid power generation system of claim 1, wherein generator is configured to vibrate in response to a fluid flowing thereover and the electrical-charge-producing material is configured to produce an alternating electrical charge in response to the generator vibrating.

3. The fluid power generation system of claim 1, wherein at least one of the pair of end boundary constraints is an active boundary constraint.

4. The fluid power generation system of claim 1, wherein charge-producing material is a piezoelectric material.

5. The fluid power generation system of claim 1, wherein each of the pair of end boundary constraints is a passive boundary constraint.

6. The fluid power generation system of claim 1, wherein each of the pair of end boundary constraints comprises a translational stiffness element and/or a torsional stiffness element.

7. The fluid power generation system of claim 6, wherein the translational stiffness element and/or the torsional stiffness element comprise piezoelectric material or shape memory material.

8. The fluid power generation system of claim 1, further comprising a tension adjuster physically coupled to one of the ends of the charge-producing material.

9. The fluid power generation system of claim 8, wherein the tension adjuster is an active tension adjuster.

10. The fluid power generation system of claim 9, wherein the active tension adjuster comprises piezoelectric material or shape memory material.

11. The fluid power generation system of claim 1, further comprising one or more masses located on the generator.

12. The fluid power generation system of claim 11, wherein at least one of the one or more masses is an active mass.

13. The fluid power generation system of claim 1, wherein at least one of the side boundary constraints is an active side boundary constraint.

14. The fluid power generation system of claim 13, wherein the at least one of the side boundary constraints that is an active side boundary constraint comprises piezoelectric material or shape memory material.

15. The fluid power generation system of claim 1, further comprising a converter electrically coupled to the generator and configured to convert AC voltage received from the generator to DC voltage.

16. The fluid power generation system of claim 1, wherein the generator is on a substrate.

17. The fluid power generation system of claim 16, wherein the generator is a first generator, and further comprising a second generator, wherein the first and second generators are on opposing surfaces of the substrate.

18. The fluid power generation system of claim 1, wherein the generator is a first generator, wherein the pair of end boundary constraints is a pair of first end boundary constraints, and further comprising:
   a second generator located above the first generator, the second generator comprising an electrical-charge-producing material; and
   a pair of second end boundary constraints;
   wherein one of the second end boundary constraints of the pair of second end boundary constraints is physically coupled to the electrical-charge-producing material of the second generator adjacent to an end of the electrical-charge-producing material of the second generator and the other one of the pair of second end boundary constraints is physically coupled the electrical-charge-producing material of the second generator adjacent to an opposite end of the electrical-charge-producing material of the second generator.

19. The fluid power generation system of claim 1, wherein the generator further comprises:
   a plurality of individual, separated electrodes electrically coupled to a surface of the electrical-charge-producing material; and
   a single electrode electrically coupled to an opposing surface of the electrical-charge-producing material.

20. The fluid power generation system of claim 1, wherein the generator further comprises notches formed in the sides thereof.

21. The fluid power generation system of claim 1, further comprising a controller electrically coupled to at least one of the end boundary constraints.

22. The fluid power generation system of claim 21, wherein the controller is electrically coupled to the generator for receiving an AC signal generated by the electrical-charge-producing material when the generator vibrates.

23. The fluid power generation system of claim 21, wherein the controller is further electrically coupled to at least one of at least one of the side boundary constraints, at least one mass located on the generator, and a tension adjuster physically coupled to one of the ends of the charge-producing material.

24. The fluid power generation system of claim 21, wherein the controller is further electrically coupled to a flow sensor for receiving electrical signals from the flow sensor indicative of a flow rate of a fluid in which generator is located.

25. A fluid power generation system, comprising:
   a generator comprising an electrical-charge-producing material that can produce an electrical charge when the generator vibrates in response to a fluid flowing over the generator;
   at least one of a boundary constraint physically coupled to the generator, a mass located on the generator, and a tension adjuster physically coupled to an end of the generator; and
   a controller electrically coupled to the generator and to at least one of the at least one of the boundary constraint physically coupled to the generator, the mass located on the generator, and the tension adjuster physically coupled to the end of the generator.

26. The power generation system of claim 25, wherein the controller is configured to cause at least one of a stiffness of the boundary constraint, a distribution of the mass, and a tension exerted by the tension adjuster on the generator to be adjusted based on a flow rate of the flowing fluid and/or a power generated by the generator.

27. A method of operating a fluid power generation system, comprising:
   vibrating a generator of the fluid power generation system in response to a fluid flowing over the generator so that a charge-producing material of the generator, vibrating with the generator, produces a power output, wherein a boundary constraint is physically coupled to the generator, a mass is located on the generator, and/or a tension adjuster is physically coupled to the generator;
   receiving an electrical signal at a controller of the fluid power generation system; and
   adjusting the power output generated by the charge-producing material in response to the electrical signal having a particular value by sending electrical signals from the controller to respective ones of the boundary constraint, mass, and/or tension adjuster for adjusting a stiffness of the boundary constraint, a distribution of the mass, and/or tension exerted by the tension adjuster on the generator.

28. The method of claim 27, wherein the particular value of the electrical signal is indicative of a particular flow rate of the fluid flowing over the generator.

29. The method of claim 27, wherein the particular value of the electrical signal is indicative of the power output produced by the charge-producing material.

30. The method of claim 29, further comprising:
   comparing the particular value to a value indicative of a desired power output for the charge-producing material; and
   wherein adjusting the power output generated by the charge-producing material in response to the electrical signal having a particular value occurs when the particular value differs from the value indicative of the desired power output for the charge-producing material by at least a certain amount.

31. The fluid power generation system of claim 18, wherein the side boundary constraint is a first side boundary constraint physically coupled to each of opposing sides of the first generator, and further comprising a second side boundary constraint physically coupled to each of opposing sides of the second generator.

* * * * *